(12) United States Patent
Qu et al.

(10) Patent No.: US 11,101,368 B2
(45) Date of Patent: Aug. 24, 2021

(54) METHOD OF FORMING CRYSTALLIZED SEMICONDUCTOR LAYER, METHOD OF FABRICATING THIN FILM TRANSISTOR, THIN FILM TRANSISTOR, AND DISPLAY APPARATUS

(71) Applicants: BEIJING BOE DISPLAY TECHNOLOGY CO., LTD., Beijing (CN); BOE Technology Group Co., Ltd., Beijing (CN)

(72) Inventors: Lianjie Qu, Beijing (CN); Hebin Zhao, Beijing (CN); Yonglian Qi, Beijing (CN); Yun Qiu, Beijing (CN); Dan Wang, Beijing (CN)

(73) Assignees: BEIJING BOE DISPLAY TECHNOLOGY CO., LTD., Beijing (CN); BOE Technology Group Co., Ltd., Beijing (CN)

(*) Notice: Subject to any disclaimer, the term of this patent is extended or adjusted under 35 U.S.C. 154(b) by 16 days.

(21) Appl. No.: 16/638,924

(22) PCT Filed: Mar. 5, 2019

(86) PCT No.: PCT/CN2019/077007
§ 371 (c)(1),
(2) Date: Feb. 13, 2020

(87) PCT Pub. No.: WO2020/177080
PCT Pub. Date: Sep. 10, 2020

(65) Prior Publication Data
US 2021/0217872 A1    Jul. 15, 2021

(51) Int. Cl.
*H01L 29/66* (2006.01)
*H01L 21/02* (2006.01)
(Continued)

(52) U.S. Cl.
CPC .... *H01L 29/6675* (2013.01); *H01L 21/02488* (2013.01); *H01L 21/02532* (2013.01);
(Continued)

(58) Field of Classification Search
CPC .......... H01L 29/6675; H01L 29/41733; H01L 29/4908; H01L 29/78651; H01L 29/7869;
(Continued)

(56) References Cited

U.S. PATENT DOCUMENTS

2016/0020095 A1* 1/2016 Kwok ............... H01L 29/66757
257/64
2018/0190490 A1* 7/2018 Ma .................... H01L 21/02672

* cited by examiner

*Primary Examiner* — Mohammed R Alam
(74) *Attorney, Agent, or Firm* — Intellectual Valley Law, P.C.

(57) ABSTRACT

A method of forming a crystallized semiconductor layer includes forming an insulating crystallization inducing layer on a base substrate; forming a semiconductor material layer on a side of the insulating crystallization inducing layer away from the base substrate by depositing a semiconductor material on the insulating crystallization inducing layer, the semiconductor material being deposited at a deposition temperature that induces crystallization of the semiconductor material; forming an alloy crystallization inducing layer including an alloy on a side of the semiconductor material layer away from the insulating crystallization inducing layer; and annealing the alloy crystallization inducing layer to further induce crystallization of the semiconductor material to form the crystallized semiconductor layer. Annealing the alloy crystallization inducing layer is performed to enrich a relatively more conductive element of the alloy to a side away from the base substrate, thereby forming an annealed crystallization inducing layer.

20 Claims, 7 Drawing Sheets

(51) Int. Cl.
*H01L 29/786* (2006.01)
*H01L 29/45* (2006.01)
*H01L 29/417* (2006.01)
*H01L 29/49* (2006.01)

(52) U.S. Cl.
CPC .. *H01L 21/02672* (2013.01); *H01L 29/41733* (2013.01); *H01L 29/458* (2013.01); *H01L 29/4908* (2013.01); *H01L 29/7869* (2013.01); *H01L 29/78651* (2013.01)

(58) Field of Classification Search
CPC ......... H01L 21/02672; H01L 21/02532; H01L 29/458; H01L 21/02488
See application file for complete search history.

METHOD OF FORMING CRYSTALLIZED SEMICONDUCTOR LAYER, METHOD OF FABRICATING THIN FILM TRANSISTOR, THIN FILM TRANSISTOR, AND DISPLAY APPARATUS

CROSS-REFERENCE TO RELATED APPLICATION

This application is a national stage application under 35 U.S.C. § 371 of International Application No. PCT/CN2019/077007, filed Mar. 5, 2019, the contents of which are incorporated by reference in the entirety.

TECHNICAL FIELD

The present invention relates to semiconductor technology, more particularly, to a method of forming a crystallized semiconductor layer, a method of fabricating a thin film transistor, a thin film transistor, and a display apparatus.

BACKGROUND

Display devices such as liquid crystal display (LCD) and organic light-emitting diode (OLED) have been widely used. LCD and OLED display devices use thin film transistor (TFT) to control pixels in the display panel. Examples of TFT include amorphous silicon TFT, polycrystalline silicon TFT, single crystal silicon TFT, and metal oxide TFT. A thin film transistor may be classified into a top gate type or a bottom gate type.

SUMMARY

In one aspect, the present invention provides a method of forming a crystallized semiconductor layer, comprising forming an insulating crystallization inducing layer on a base substrate; forming a semiconductor material layer on a side of the insulating crystallization inducing layer away from the base substrate by depositing a semiconductor material on the insulating crystallization inducing layer, the semiconductor material being deposited at a deposition temperature that induces crystallization of the semiconductor material; forming an alloy crystallization inducing layer comprising an alloy on a side of the semiconductor material layer away from the insulating crystallization inducing layer; and annealing the alloy crystallization inducing layer to further induce crystallization of the semiconductor material to form the crystallized semiconductor layer; wherein annealing the alloy crystallization inducing layer is performed under a condition to enrich a relatively more conductive element of the alloy to a side away from the base substrate, and enrich a relatively less conductive element of the alloy to a side closer to the base substrate, thereby forming an annealed crystallization inducing layer.

Optionally, the relatively more conductive element of the alloy of the annealed crystallization inducing layer has an increasing gradient distribution along a direction from the side closer to the base substrate to the side away from the base substrate; and the relatively less conductive element of the alloy of the annealed crystallization inducing layer has a decreasing gradient distribution along the direction from the side closer to the base substrate to the side away from the base substrate.

Optionally, the insulating crystallization inducing layer is formed using a highly textured insulating material.

Optionally, a ratio of a lattice constant of the highly textured insulating material to a lattice constant of the crystallized semiconductor layer is in a range of 1.5:1 to 1:1.5.

Optionally, the insulating crystallization inducing layer comprises a material selected from a group consisting of magnesium oxide, aluminum oxide, zirconium oxide, and hafnium oxide.

Optionally, the alloy is a metal silicon alloy; the relatively more conductive element of the alloy is a metal; and the relatively less conductive element of the alloy is silicon.

Optionally, the alloy comprises a material selected from a group consisting of gold silicon alloy, aluminum silicon alloy, tin silicon alloy, and copper silicon alloy.

Optionally, the metal in the annealed crystallization inducing layer has an increasing gradient distribution along a direction from the side closer to the base substrate to the side away from the base substrate; and silicon in the annealed crystallization inducing layer has a decreasing gradient distribution along the direction from the side closer to the base substrate to the side away from the base substrate.

Optionally, the deposition temperature is in a range of 250 Celsius degrees to 400 Celsius degrees.

In another aspect, the present invention provides a method of fabricating a thin film transistor, comprising forming the crystallized semiconductor layer according to the method described herein; patterning the annealed crystallization inducing layer and the crystallized semiconductor layer in a same patterning process using a single mask plate to form an active layer, the annealed crystallization inducing layer in a region outside a region corresponding to the active layer is substantially removed; removing the annealed crystallization inducing layer in a region corresponding to a channel part of the active layer while at least partially maintaining the annealed crystallization inducing layer in regions corresponding to a source electrode contact part and a drain electrode contact part of the active layer, thereby forming an ohmic contact layer comprising a first ohmic contact pad on the source electrode contact pail and a second ohmic contact pad on the drain electrode contact part; and forming a source electrode on a side of the first ohmic contact pad away from the base substrate, and a drain electrode on a side of the second ohmic contact pad away from the base substrate.

Optionally, prior to forming the insulating crystallization inducing layer, the method further comprises forming a gate electrode on the base substrate; wherein the insulating crystallization inducing layer is formed as a gate insulating layer insulating the gate electrode from the active layer.

In another aspect, the present invention provides a thin film transistor, comprising a base substrate; an insulating crystallization inducing layer on the base substrate; an active layer on a side of the insulating crystallization inducing layer away from the base substrate, the active layer having a channel part, a source electrode contact part, and a drain electrode contact part, the active layer comprising a crystallized semiconductor; an ohmic contact layer comprising a first ohmic contact pad on a side of the source electrode contact part away from the insulating crystallization inducing layer and a second ohmic contact pad on a side of the drain electrode contact part away from the insulating crystallization inducing layer a source electrode on a side of the first ohmic contact pad away from the base substrate; and a drain electrode on a side of the second ohmic contact pad away from the base substrate; wherein the first ohmic contact pad comprises an alloy having a relatively more conductive element of the alloy enriched on a side of the first ohmic contact pad away from the base substrate and a relatively less conductive element of the alloy enriched on a side of the first ohmic contact pad closer to the base substrate; and the second ohmic contact pad comprises an alloy having a relatively more conductive element of the alloy enriched on a side of the second ohmic contact pad away from the base substrate and a relatively less conductive element of the alloy enriched on a side of the second ohmic contact pad closer to the base substrate.

Optionally, the relatively more conductive element of the alloy of the first ohmic contact pad has an increasing gradient distribution along a direction from the side closer to the base substrate to the side away from the base substrate; the relatively less conductive element of the alloy of the first ohmic contact pad has a decreasing gradient distribution along the direction from the side closer to the base substrate to the side away from the base substrate; the relatively more conductive element of the alloy of the second ohmic contact pad has an increasing gradient distribution along the direction from the side closer to the base substrate to the side away from the base substrate; and the relatively less conductive element of the alloy of the second ohmic contact pad has a decreasing gradient distribution along the direction from the side closer to the base substrate to the side away from the base substrate.

Optionally, the insulating crystallization inducing layer comprises a highly textured insulating material.

Optionally, a ratio of a lattice constant of the highly textured insulating material to a lattice constant of the crystallized semiconductor is in a range of 1.5:1 to 1:1.5.

Optionally, the insulating crystallization inducing layer comprises a material selected from a group consisting of magnesium oxide, aluminum oxide, zirconium oxide, and hafnium oxide.

Optionally, the alloy is a metal silicon alloy; the relatively more conductive element of the alloy is a metal; the relatively less conductive element of the alloy is silicon; the first ohmic contact pad comprises the metal enriched on a side of the first ohmic contact pad away from the base substrate and silicon enriched on a side of the first ohmic contact pad closer to the base substrate; and the second ohmic contact pad comprises the metal enriched on a side of the second ohmic contact pad away from the base substrate and silicon enriched on a side of the second ohmic contact pad closer to the base substrate.

Optionally, the alloy comprises a material selected from a group consisting of gold silicon alloy, aluminum silicon alloy, tin silicon alloy, and copper silicon alloy.

Optionally, the thin film transistor further comprises a gate electrode on a side of the insulating crystallization inducing layer closer to the base substrate; wherein the insulating crystallization inducing layer functions as a gate insulating layer insulating the gate electrode from the active layer.

In another aspect, the present invention provides a display apparatus, comprising the thin film transistor described herein, and one or more integrated circuits for driving image display.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

It is discovered in the present disclosure that several issues exist in the conventional thin film transistor or a thin film transistor fabricated by the conventional method. In the conventional thin film transistor, the mobility rate has reached a bottleneck, and further improvement becomes difficult using the existing process, in the conventional crystallization inducing process, removal of crystallization inducing material remains difficult. Thus, the issue of residual crystallization inducing materials adversely affecting the performance of the thin film transistor presents a challenge.

Accordingly, the present disclosure provides, infer alia, a method of forming a crystallized semiconductor layer, a method of fabricating a thin film transistor, a thin film transistor, and a display apparatus that substantially obviate one or more of the problems due to limitations and disadvantages of the related art. In one aspect, the present disclosure provides a method of forming a crystallized semiconductor layer. In some embodiments, the method includes forming an insulating crystallization inducing layer on a base substrate; forming a semiconductor material layer on a side of the insulating crystallization inducing layer away from the base substrate by depositing a semiconductor material on the insulating crystallization inducing layer, the semiconductor material being deposited at a deposition temperature that induces crystallization of the semiconductor material; forming an alloy crystallization inducing layer including an alloy on a side of the semiconductor material layer away from the insulating crystallization inducing layer; and annealing the alloy crystallization inducing layer to further induce crystallization of the semiconductor material to form the crystallized semiconductor layer. Optionally, annealing the alloy crystallization inducing layer is performed under a condition to enrich a relatively more conductive element of the alloy to a side away from the base substrate, and enrich a relatively less conductive element of the alloy to a side closer to the base substrate, thereby forming an annealed crystallization inducing layer.

In another aspect, the present invention further provides a method of fabricating a thin film transistor. In some embodiments, the method includes forming the crystallized semiconductor layer as described herein; patterning the annealed crystallization inducing layer and the crystallized semiconductor layer in a same patterning process using a single mask plate to form an active layer, the annealed crystallization inducing layer in a region outside a region corresponding to the active layer is substantially removed; removing the annealed crystallization inducing layer in a region corresponding to a channel part of the active layer while at least partially maintaining the annealed crystallization inducing layer in regions corresponding to a source electrode contact part and a drain electrode contact part of the active layer, thereby forming an ohmic contact layer including a first ohmic contact pad on the source electrode contact part and a second ohmic contact pad on the drain electrode contact part; and forming a source electrode on a side of the first ohmic contact pad away from the base substrate, and a drain electrode on a side of the second ohmic contact pad away from the base substrate.

In another aspect, the present disclosure further provides a thin film transistor fabricated by the method described herein. In the present method, the crystallization of the semiconductor layer is performed using two crystallization inducing layers, one on top and another on bottom of the semiconductor material layer to be crystallized. The thin film transistor fabricated by the present method has an unusually high mobility rate as compared to the conventional thin film transistor, even the thin film transistor having a semiconductor layer crystallized by a conventional crystallization inducing method. Further, as compared to the conventional crystallization inducing method, the present method obviates the issue of residual crystallization inducing materials adversely affecting the performance of the thin film transistor. Removal of the crystallization inducing material does not present an issue in the present method. Also, the thin film transistor fabricated by the present method has a significantly enhanced ohmic contact between the active layer and the source/drain electrode.

Figure 1A:
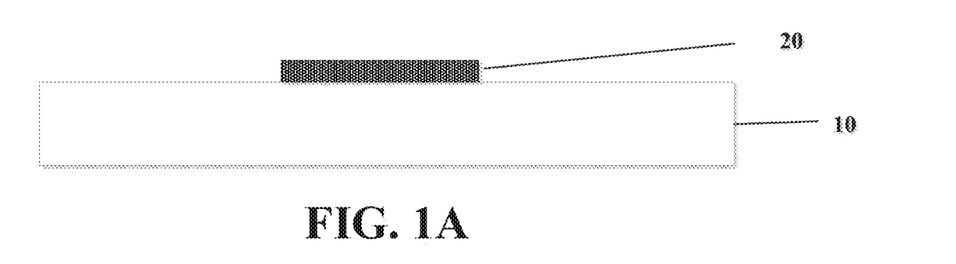
FIGS. 1A to 1H illustrates a method of forming a crystallized semiconductor layer and fabricating a thin film transistor in some embodiments according to the present disclosure.

FIGS. 1A to 1H illustrates a method of forming a crystallized semiconductor layer and fabricating a thin film transistor in some embodiments according to the present disclosure. Referring to FIG. 1A, in one example, the thin film transistor to be formed is a bottom gate type thin film transistor. The method includes first forming a gate electrode 20 on a base substrate 10.

Various appropriate conductive electrode materials and various appropriate fabricating methods may be used to make the gate electrode 20. For example, a conductive electrode material may be deposited on the substrate by, e.g., sputtering or vapor deposition, and patterned by, e.g., lithography such as a wet etching process to form a gate electrode 20. Examples of appropriate conductive electrode materials include, but are not limited to, aluminum, chromium, tungsten, titanium, tantalum, molybdenum, copper, and alloys or laminates containing the same.

Optionally, the gate electrode 20 is formed to have a thickness in a range of 1000 nm to 5000 nm.

Figure 1B:
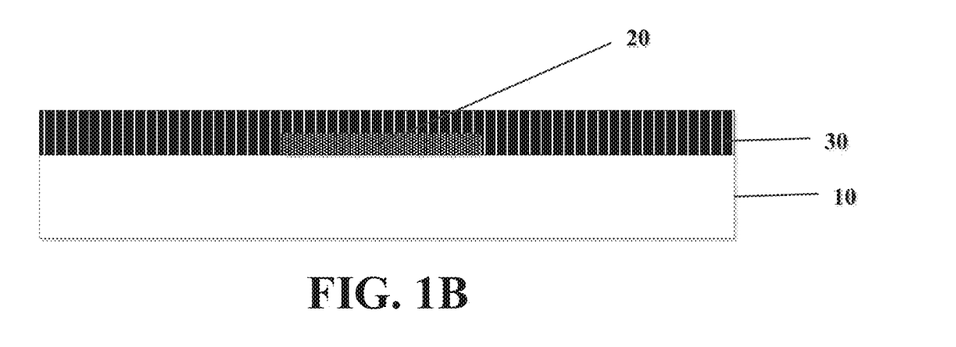

Referring to FIG. 1B, subsequent to forming the gate electrode 20, an insulating crystallization inducing layer 30 is formed on a side of the gate electrode 20. In case the thin film transistor is a bottom gate type thin film transistor as described in FIG. 1A to 1H, the insulating crystallization inducing layer 30 not only functions as a crystallization inducing layer during the fabrication of the crystallized semiconductor layer, but at the same time functions as a gate insulating layer insulating the gate electrode 20 and the active layer (to be formed subsequently) from each other.

Various appropriate insulating and crystallization inducing materials may be used for making the insulating crystallization inducing layer 30. In some embodiments, the insulating crystallization inducing layer 30 is formed using a highly textured insulating material. As used herein, the term "textured" refers to crystals in a layer have preferential orientation, e.g., out-of-plane or in-plane, or both. Optionally, the material for making the insulating crystallization inducing layer 30 is selected so that a lattice constant of the highly textured insulating material is similar to a lattice constant of the crystallized semiconductor layer, to promote the crystallization induction process. Optionally, a material for making the insulating crystallization inducing layer 30 is selected so that a ratio of a lattice constant of the highly textured insulating material to a lattice constant of the crystallized semiconductor layer is in a range of 1.5:1 to 1:1.5, e.g., 1.4:1 to 1:1.4, 1.3:1 to 1:1.3, 1.2:1 to 1:1.2, 1.1:1 to 1:1.1, and 1.05:1 to 1:1.05. Examples of appropriate insulating and crystallization inducing materials for making the insulating crystallization inducing layer 30 include magnesium oxide, aluminum oxide, zirconium oxide, and hafnium oxide.

The insulating crystallization inducing layer 30 can be made of various appropriate thickness. Optionally, the insulating crystallization inducing layer 30 is formed to have a thickness in a range of 500 nm to 2000 nm, e.g., 500 nm to 700 nm, 700 nm to 900 nm, 900 nm to 1000 nm, 1000 nm to 1200 nm, 1200 nm to 1400 nm, 1400 nm to 1600 nm, 1600 nm to 1800 nm, and 1800 nm to 2000 nm.

Figure 1C:
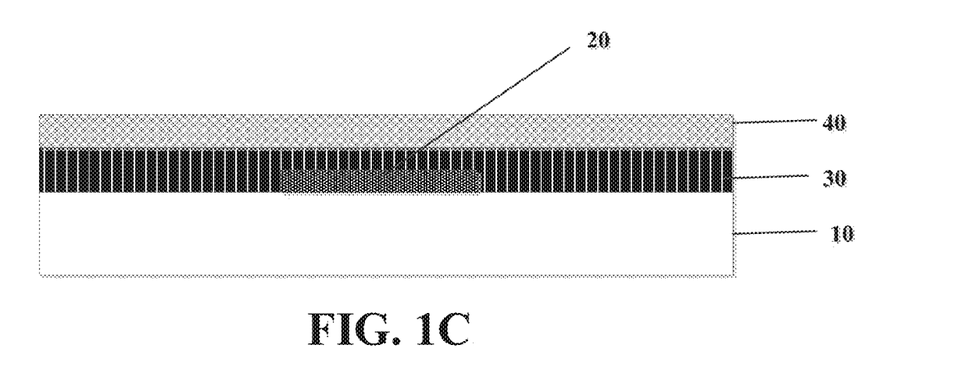

Referring to FIG. 1C, a semiconductor material layer 40 is then formed on a side of the insulating crystallization inducing layer away from the base substrate 10. For example, a semiconductor material is deposited on the insulating crystallization inducing layer 30 at a deposition temperature that induces crystallization of the semiconductor material. Various appropriate deposition methods may be used for depositing the semiconductor material. In one example, the semiconductor material (e.g., silicon) is deposited in a vapor deposition process, e.g., a plasma-enhanced chemical vapor deposition (PECVD) process. In another example, the semiconductor material (e.g., semiconductor oxides) is deposited using a sputtering process, e.g., a magnetron sputtering process. In order to effectively induce crystallization of the semiconductor material by the insulating crystallization inducing layer 30, a certain deposition temperature is required (either in a vapor deposition process or in a sputtering process). Optionally, the deposition temperature is in a range of 250 Celsius degrees to 400 Celsius degrees, e.g., 250 Celsius degrees to 300 Celsius degrees, 300 Celsius degrees to 350 Celsius degrees, and 350 Celsius degrees to 400 Celsius degrees.

Figure 1D:
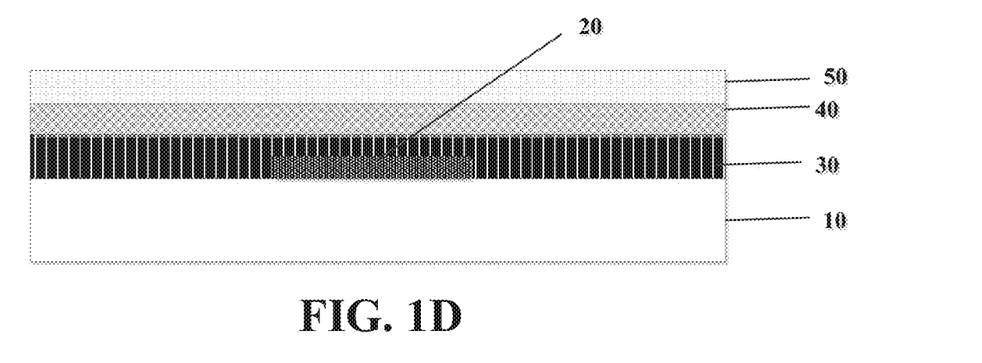

Referring to FIG. 1D, the method in some embodiments further includes forming (e.g., depositing) an alloy crystallization inducing layer 50 including an alloy on a side of the semiconductor material layer 40 away from the insulating crystallization inducing layer 30. In some embodiments, the alloy includes a relatively more conductive element (e.g., a conductive element) and a relatively less conductive element (e.g., a semi-conductive element). Optionally, the alloy is an alloy of a metal and a semiconductor material, e.g., a metal-silicon alloy. Examples of appropriate alloys include gold silicon alloy, aluminum silicon alloy, tin silicon alloy, and copper silicon alloy.

Figure 1E:
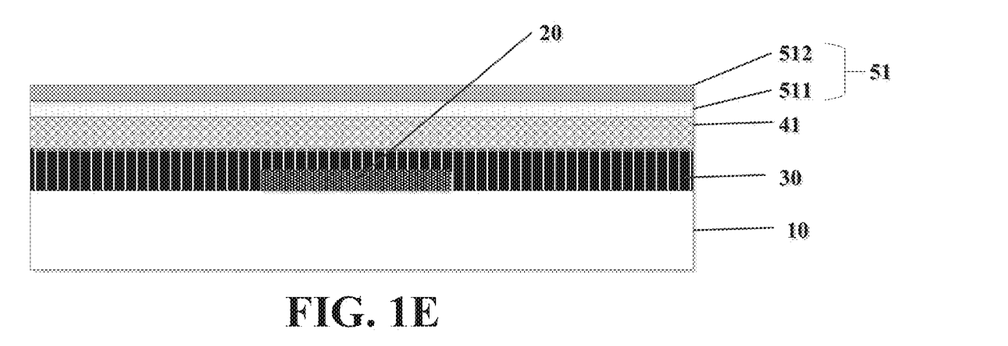

In some embodiments, subsequent to forming the alloy crystallization inducing layer 50, the method further includes annealing the alloy crystallization inducing layer 50 to further induce crystallization of the semiconductor material. Referring to FIG. 1E, subsequent to annealing the alloy crystallization inducing layer, a crystallized semiconductor layer 41 is formed in which the semiconductor material is crystallized.

In some embodiments, the step of annealing the alloy crystallization inducing layer is performed under a condition to enrich a relatively more conductive element of the alloy to a side away from the base substrate 10, and enrich a relatively less conductive element of the alloy to a side closer to the base substrate 10, thereby forming an annealed crystallization inducing layer 51. The ratio of the relatively more conductive element to the relatively less conductive element can be controlled so that various types of separation between the relatively more conductive element and the relatively less conductive element can be achieved.

Figure 1F:
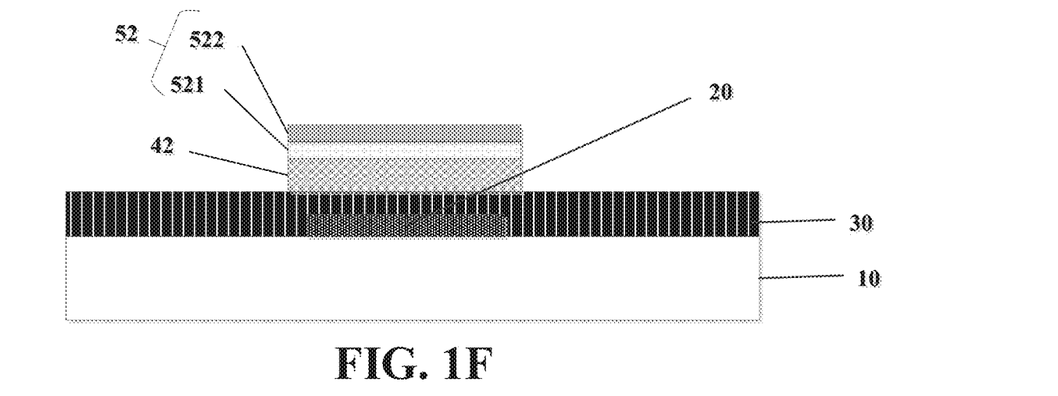

Referring to FIG. 1F, in some embodiments, subsequent to the step of annealing the alloy crystallization inducing layer, the annealed crystallization inducing layer 51 is separately into at least two sub-layers, including a first sub-layer 511 and a second sub-layer 512. The second sub-layer 512 is on a side of the first sub-layer 511 away from the base substrate. In the second sub-layer 512, the relatively more conductive element of the alloy is enriched. In the first sub-layer 511, the relatively less conductive element of the alloy is enriched. In one example, the alloy is a metal-silicon alloy, the second sub-layer 512 is a metal sub-layer formed by the metal precipitated out of the alloy during the annealing process, and the first sub-layer 511 is silicon enriched as the metal precipitated out into the second sub-layer 512.

Various appropriate annealing methods may be used to anneal the alloy crystallization inducing layer. Examples of appropriate annealing methods include laser annealing and high heat annealing.

Referring to FIG. 1F, subsequent to the annealing step, the crystallized semiconductor layer 41 and the annealed crystallization inducing layer 51 are patterned, e.g., using a lithography process. Optionally, the method includes patterning the annealed crystallization inducing layer and the crystallized semiconductor layer in a same patterning process using a single mask plate to form an active layer 42, the annealed crystallization inducing layer in a region outside a region corresponding to the active layer is substantially removed, thereby forming a patterned annealed crystallization inducing layer 52 (including a first patterned sub-layer 521 and a second patterned sub-layer 522). Optionally, an orthographic projection of the patterned annealed crystallization inducing layer 52 on the base substrate 10 substantially overlaps with an orthographic projection of the active layer 42 on the base substrate 10. Optionally, patterning the annealed crystallization inducing layer and the crystallized semiconductor layer is performed using a dry etching process.

Figure 1G:
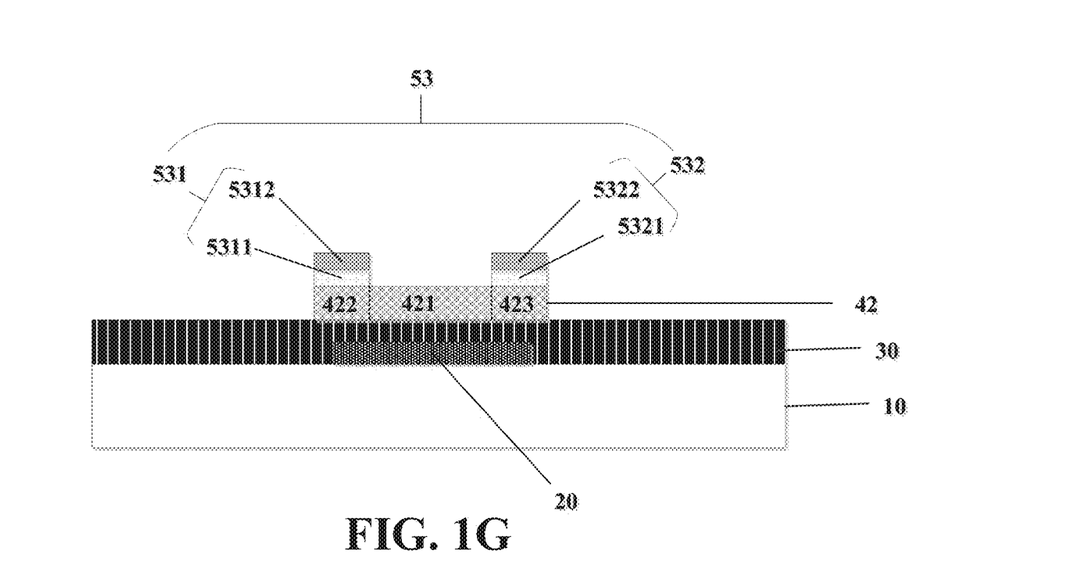

Referring to FIG. 1G, subsequent to patterning the annealed crystallization inducing layer and the crystallized semiconductor layer, the method further includes removing the patterned annealed crystallization inducing layer in a region corresponding to a channel part 421 of the active layer 42 while at least partially maintaining the annealed crystallization inducing layer in regions corresponding to a source electrode contact part 422 and a drain electrode contact part 423 of the active layer 42, thereby forming an ohmic contact layer 53. Optionally, the ohmic contact layer 53 is formed to include a first ohmic contact pad 531 on the source electrode contact part 422 and a second ohmic contact pad 532 on the drain electrode contact part 423. The first ohmic contact pad 531 is formed to have a relatively more conductive element of the alloy enriched on a side of the first ohmic contact pad 531 away from the base substrate 10 and a relatively less conductive element of the alloy enriched on a side of the first ohmic contact pad 531 closer to the base substrate 10, and the second ohmic contact pad 532 is formed to have a relatively more conductive element of the alloy enriched on a side of the second ohmic contact pad 532 away from the base substrate 10 and a relatively less conductive element of the alloy enriched on a side of the second ohmic contact pad 532 closer to the base substrate 10. In one example, the first ohmic contact pad 531 is formed to have a metal enriched on a side of the first ohmic contact pad 531 away from the base substrate 10 and silicon enriched on a side of the first ohmic contact pad 531 closer to the base substrate 10, and the second ohmic contact pad is formed to have the metal enriched on a side of the second ohmic contact pad 532 away from the base substrate 10 and silicon enriched on a side of the second ohmic contact pad 532 closer to the base substrate 10.

Optionally, during the step of removing the patterned annealed crystallization inducing layer in the region corresponding to a channel part 421 of the active layer 42, over-etching technique may be adopted to ensure complete or near-complete removal of residual alloy material in the region corresponding to a channel part 421. Optionally, a 50% over-etching is used in the step of removing the patterned annealed crystallization inducing layer in the region corresponding to a channel part 421 of the active layer 42.

Optionally, as shown in FIG. 1G, the first ohmic contact pad 531 is formed to include a sub-layer 5311 and a sub-layer 5312 on a side of the sub-layer 5311 away from the base substrate 10. In the sub-layer 5312, the relatively more conductive element of the alloy is enriched. In the sub-layer 5311, the relatively less conductive element of the alloy is enriched. In one example, the alloy is a metal-silicon alloy, the sub-layer 5312 is a metal sub-layer, and the sub-layer 5311 is silicon enriched as compared to the sub-layer 5312.

Optionally, as shown in FIG. 1G, the second ohmic contact pad 532 is formed to include a sub-layer 5321 and a sub-layer 5322 on a side of the sub-layer 5321 away from the base substrate 10. In the sub-layer 5321, the relatively more conductive element of the alloy is enriched. In the sub-layer 5322, the relatively less conductive element of the alloy is enriched. In one example, the alloy is a metal-silicon alloy, the sub-layer 5321 is a metal sub-layer, and the sub-layer 5322 is silicon enriched as compared to the sub-layer 5321.

The ohmic contact layer 53 in the present thin film transistor includes a relatively less conductive element (e.g., a semiconductor element such as silicon) enriched on a side in contact with the active layer 42 and a relatively more conductive element (e.g., a metal element) enriched on a side in contact with the source/drain electrode, the ohmic contact layer 53 transitions from the relatively less conductive element to the relatively more conductive element along the direction from the active layer 42 to the source/drain electrode, significantly enhancing the ohmic contact properties of the ohmic contact layer 53, in a thin film transistor fabricated by the present method, the ON-state current of the thin film transistor can be enhanced, enhancing the driving capability of the thin film transistor for the light emitting element.

Optionally, the steps described in FIG. 1F and FIG. 1G can be performed in same patterning process using a single mask plate, e.g., a half-tone mask plate or a gray tone mask plate. For example, the method includes patterning the annealed crystallization inducing layer and the crystallized semiconductor layer, and removing the annealed crystallization inducing layer in a region corresponding to a channel part 421 of the active layer 42 while at least partially maintaining the annealed crystallization inducing layer in regions corresponding to a source electrode contact part 422 and a drain electrode contact part 423 of the active layer 42, in a same patterning process using a single mask plate, thereby forming the active layer 42, and an ohmic contact layer 53 including a first ohmic contact pad 531 on the source electrode contact part 422 and a second ohmic contact pad 532 on the drain electrode contact part 423.

Figure 1H:
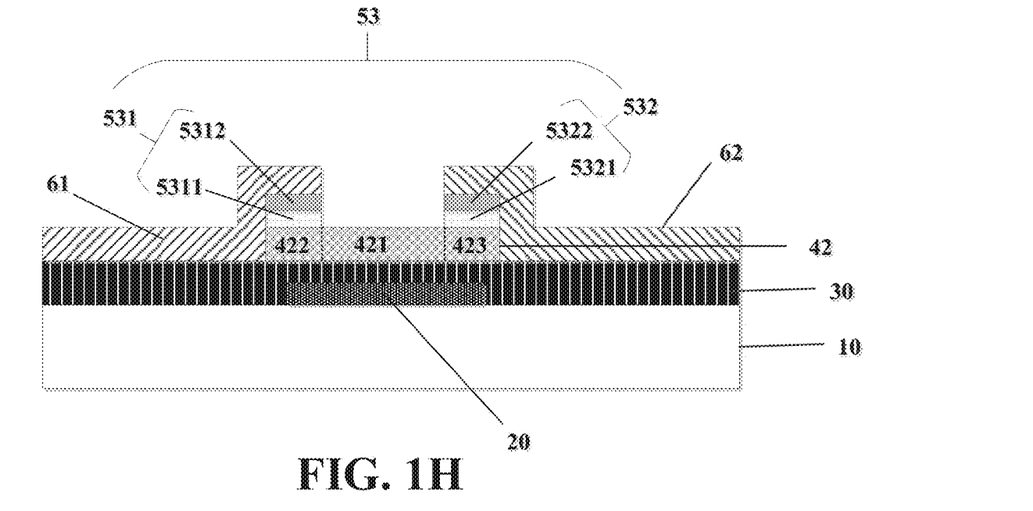

Referring to FIG. 1H, the method in some embodiments further includes forming a source electrode 61 on a side of the first ohmic contact pad 531 away from the base substrate 10, and a drain electrode 62 on a side of the second ohmic contact pad 532 away from the base substrate 10. Because the channel is formed at the bottom side of the channel part, the effects of residual alloy on the performance of the thin film transistor can be minimized.

The present method greatly simplifies the fabrication process of the thin film transistor. Because the present method adopts two crystallization inducing layers, the degree of crystallization can be significantly improved, resulting in enhanced properties of the active layer. As a result, a high mobility rate can be achieved in a thin film transistor fabricated by the present method. The present method also obviates the need of de-hydrogenation, re-hydrogenation, and doping that are required in the conventional processes. The alloy crystallization inducing layer can be patterned as an ohmic contact layer, further simplifies the fabrication process. The ohmic contact layer transitions from the relatively less conductive element to the relatively more conductive element along the direction from the active layer to the source/drain electrode, significantly enhancing the ohmic contact properties of the ohmic contact layer. The alloy crystallization inducing layer in the region corresponding to a channel part of the active layer is removed, e.g., by over-etching. The adverse effects of residual alloy material can be minimized or substantially eliminated.

Figure 2A:
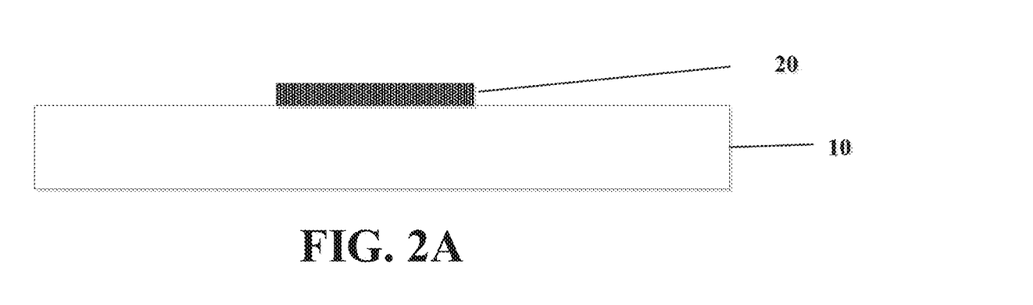
FIGS. 2A to 2H illustrates a method of forming a crystallized semiconductor layer and fabricating a thin film transistor in some embodiments according to the present disclosure.
Figure 2B:
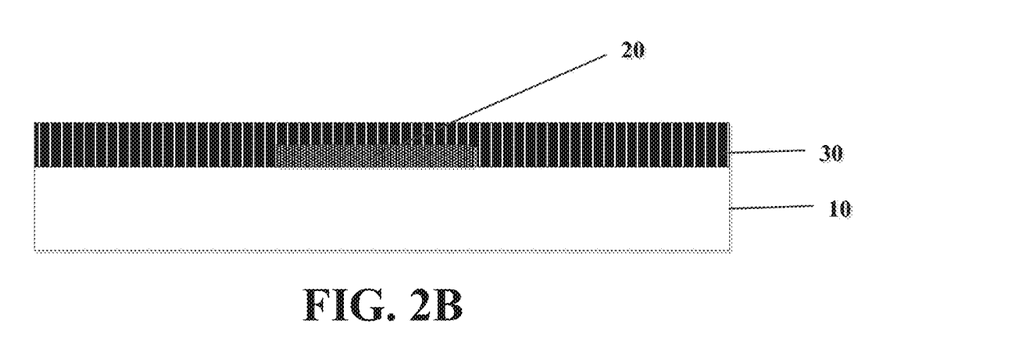
Figure 2C:
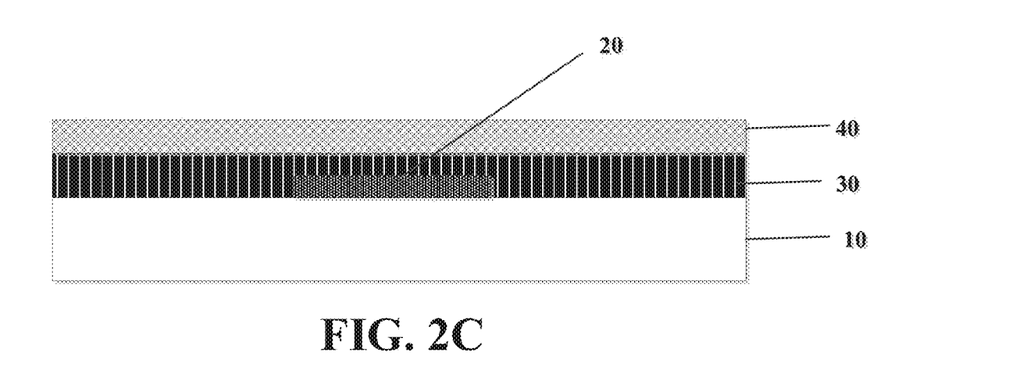
Figure 2D:
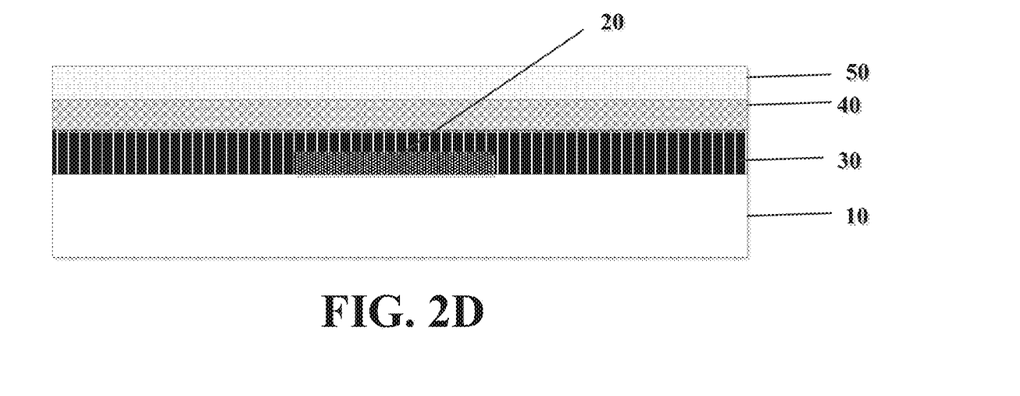
Figure 2E:
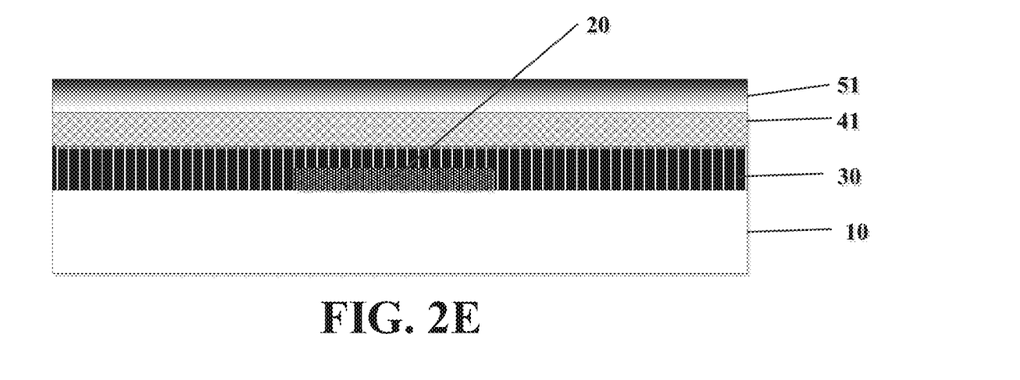

FIGS. 2A to 2H illustrates a method of forming a crystallized semiconductor layer and fabricating a thin film transistor in some embodiments according to the present disclosure. The processes described in FIGS. 2A to 2D are substantially similar to the processes described in FIGS. 1A to 1D. Referring to FIG. 2E, in some embodiments, the ratio of the relatively more conductive element to the relatively less conductive element can be controlled so that the annealed crystallization inducing layer 51 is not separately into sub-layers. For example, the annealed crystallization inducing layer 51 remains as a single layer with the elements therein having gradient distribution along a direction from the side closer to the base substrate to the side away from the base substrate. In the present disclosure, the "gradient distribution" of elements refers to that content of the elements is different at different positions of an alloy, which form gradient distribution of content. Optionally, the relatively more conductive element of the alloy of the annealed crystallization inducing layer 51 has an increasing gradient distribution along a direction from the side closer to the base substrate 10 to the side away from the base substrate 10. Optionally, the relatively less conductive element of the alloy of the annealed crystallization inducing layer 51 has a decreasing gradient distribution along the direction from the side closer to the base substrate 10 to the side away from the base substrate 10. In one example, the alloy is a metal-silicon alloy, the metal in the annealed crystallization inducing layer 51 has an increasing gradient distribution along a direction from the side closer to the base substrate 10 to the side away from the base substrate 10, and silicon in the annealed crystallization inducing layer 51 has a decreasing gradient distribution along the direction from the side closer to the base substrate 10 to the side away from the base substrate 10.

Figure 2F:
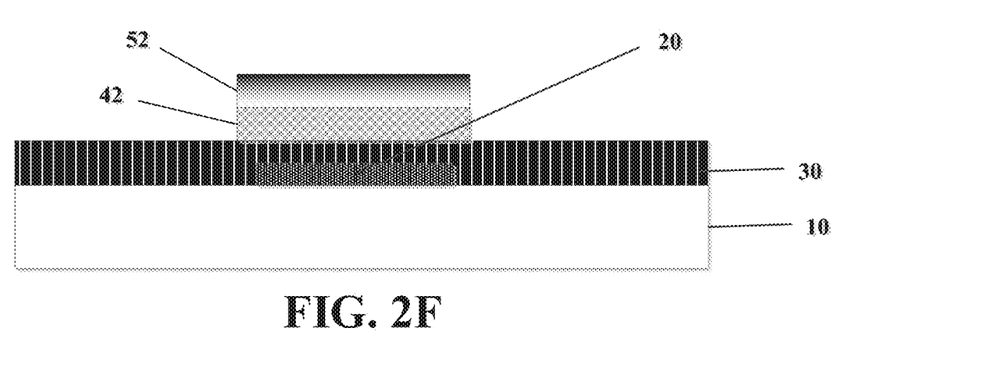

Referring to FIG. 2F, subsequent to the annealing step, the crystallized semiconductor layer 41 and the annealed crystallization inducing layer 51 are patterned, e.g., using a lithography process. Optionally, the method includes patterning the annealed crystallization inducing layer and the crystallized semiconductor layer in a same patterning process using a single mask plate to form an active layer 42, the annealed crystallization inducing layer in a region outside a region corresponding to the active layer is substantially removed, thereby forming a patterned annealed crystallization inducing layer 52. Optionally, the relatively more conductive element of the alloy of the patterned annealed crystallization inducing layer 52 has an increasing gradient distribution along a direction from the side closer to the base substrate 10 to the side away from the base substrate 10, and the relatively less conductive element of the alloy of the patterned annealed crystallization inducing layer 52 has a decreasing gradient distribution along the direction from the side closer to the base substrate 10 to the side away from the base substrate 10.

Figure 2G:
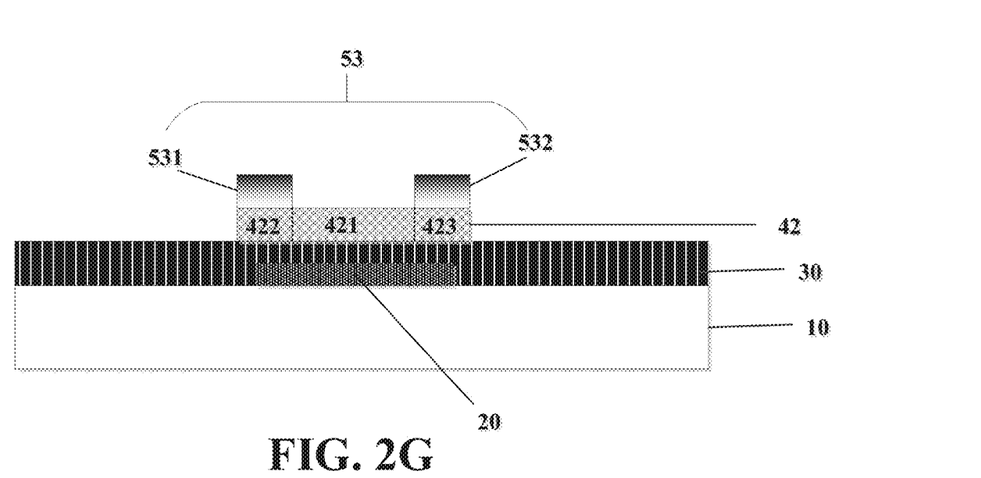

Referring to FIG. 2G, subsequent to patterning the annealed crystallization inducing layer and the crystallized semiconductor layer, the method further includes removing the patterned annealed crystallization inducing layer in a region corresponding to a channel part 421 of the active layer 42 while at least partially maintaining the annealed crystallization inducing layer in regions corresponding to a source electrode contact part 422 and a drain electrode contact part 423 of the active layer 42, thereby forming an ohmic contact layer 53. Optionally, the ohmic contact layer 53 is formed to include a first ohmic contact pad 531 on the source electrode contact part 422 and a second ohmic contact pad 532 on the drain electrode contact part 423. The first ohmic contact pad 531 is formed to have a relatively more conductive element of the alloy enriched on a side of the first ohmic contact pad 531 away from the base substrate 10 and a relatively less conductive element of the alloy enriched on a side of the first ohmic contact pad 531 closer to the base substrate 10, and the second ohmic contact pad 532 is formed to have a relatively more conductive element of the alloy enriched on a side of the second ohmic contact pad 532 away from the base substrate 10 and a relatively less conductive element of the alloy enriched on a side of the second ohmic contact pad 532 closer to the base substrate 10.

Optionally, the first ohmic contact pad 531 is formed so that the relatively more conductive element of the alloy of the first ohmic contact pad 531 has an increasing gradient distribution along a direction from the side closer to the base substrate 10 to the side away from the base substrate 10, and the relatively less conductive element of the alloy of the first ohmic contact pad 531 has a decreasing gradient distribution along the direction from the side closer to the base substrate 10 to the side away from the base substrate 10.

Optionally, the second ohmic contact pad 532 is formed so that the relatively more conductive element of the alloy of the second ohmic contact pad 532 has an increasing gradient distribution along the direction from the side closer to the base substrate 10 to the side away from the base substrate 10, and the relatively less conductive element of the alloy of the second ohmic contact pad 532 has a decreasing gradient distribution along the direction from the side closer to the base substrate 10 to the side away from the base substrate 10.

In one example, the alloy is a metal silicon alloy, the relatively more conductive element of the alloy is a metal, and the relatively less conductive element of the alloy is silicon. Optionally, the first ohmic contact pad 531 is formed so that the metal of the alloy of the first ohmic contact pad 531 has an increasing gradient distribution along a direction from the side closer to the base substrate 10 to the side away from the base substrate 10, and silicon of the alloy of the first ohmic contact pad 531 has a decreasing gradient distribution along the direction from the side closer to the base substrate 10 to the side away from the base substrate 10. Optionally, the second ohmic contact pad 532 is formed so that the metal of the alloy of the second ohmic contact pad 532 has an increasing gradient distribution along the direction from the side closer to the base substrate 10 to the side away from the base substrate 10, and silicon of the alloy of the second ohmic contact pad 532 has a decreasing gradient distribution along the direction from the side closer to the base substrate 10 to the side away from the base substrate 10.

Figure 2H:
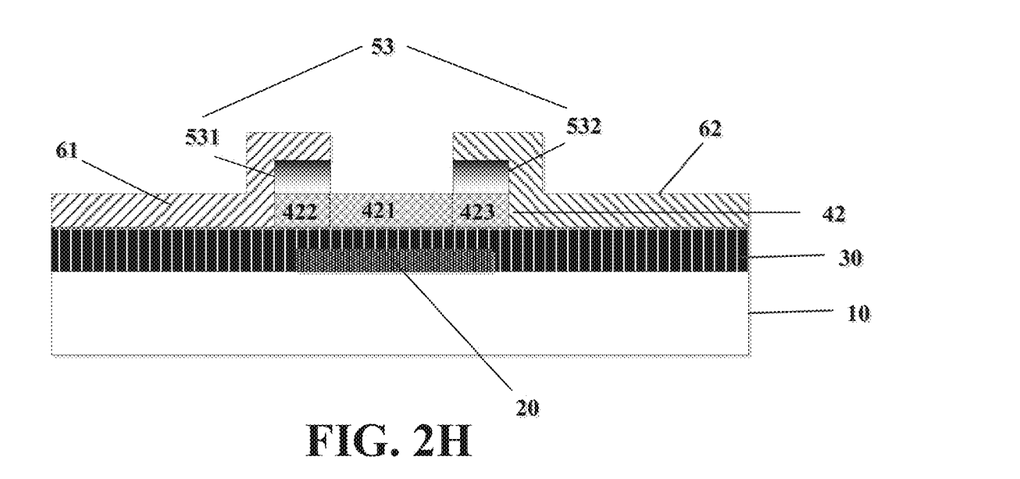

The process described in FIG. 2H is substantially; similar to the process described in FIG. 1H.

In another aspect, the present disclosure provides a thin film transistor. In some embodiments, and referring to FIG. 1H and FIG. 2H, the thin film transistor includes a base substrate 10; an insulating crystallization inducing layer 30 on the base substrate 10; an active layer 42 on a side of the insulating crystallization inducing layer 30 away from the base substrate 10, the active layer 42 including a channel part 421, a source electrode contact part 422, and a drain electrode contact part 423, the active layer 42 including a crystallized semiconductor; an ohmic contact layer 53 including a first ohmic contact pad 531 on a side of the source electrode contact part 422 away from the insulating crystallization inducing layer 30 and a second ohmic contact pad 532 on a side of the drain electrode contact part 423 away from the insulating crystallization inducing layer 30; a source electrode 61 on a side of the first ohmic contact pad 531 away from the base substrate 10; and a drain electrode 62 on a side of the second ohmic contact pad 532 away from the base substrate 10. Optionally, the first ohmic contact pad 531 includes an alloy having a relatively more conductive element of the alloy enriched on a side of the first ohmic contact pad 531 away from the base substrate 10 and a relatively less conductive element of the alloy enriched on a side of the first ohmic contact pad 531 closer to the base substrate 10. Optionally, the second ohmic contact pad 532 includes an alloy having a relatively more conductive element of the alloy enriched on a side of the second ohmic contact pad 532 away from the base substrate 10 and a relatively less conductive element of the alloy enriched on a side of the second ohmic contact pad 532 closer to the base substrate 10. In one example, the first ohmic contact pad 531 has a metal enriched on a side of the first ohmic contact pad 531 away from the base substrate 10 and silicon enriched on a side of the first ohmic contact pad 531 closer to the base substrate 10, and the second ohmic contact pad has the metal enriched on a side of the second ohmic contact pad 532 away from the base substrate 10 and silicon enriched on a side of the second ohmic contact pad 532 closer to the base substrate 10.

In some embodiments, and referring to FIG. 1H, the first ohmic contact pad 531 includes a sub-layer 5311 and a sub-layer 5312 on a side of the sub-layer 5311 away from the base substrate 10. In the sub-layer 5312, the relatively more conductive element of the alloy is enriched. In the sub-layer 5311, the relatively less conductive element of the alloy is enriched. In one example, the alloy is a metal-silicon alloy, the sub-layer 5312 is a metal sub-layer, and the sub-layer 5311 is silicon enriched as compared to the sub-layer 5312.

In some embodiments, and referring to FIG. 1H, the second ohmic contact pad 532 includes a sub-layer 5321 and a sub-layer 5322 on a side of the sub-layer 5321 away from the base substrate 10. In the sub-layer 5322, the relatively more conductive element of the alloy is enriched. In the sub-layer 5321, the relatively less conductive element of the alloy is enriched. In one example, the alloy is a metal-silicon alloy, the sub-layer 5322 is a metal sub-layer, and the sub-layer 5321 is silicon enriched as compared to the sub-layer 5322.

In some embodiments, and referring to FIG. 2H, the relatively more conductive element of the alloy of the first ohmic contact pad 531 has an increasing gradient distribution along a direction from the side closer to the base substrate 10 to the side away from the base substrate 10; and the relatively less conductive element of the alloy of the first ohmic contact pad 531 has a decreasing gradient distribution along the direction from the side closer to the base substrate 10 to the side away from the base substrate 10.

In some embodiments, and referring to FIG. 2H, the relatively more conductive element of the alloy of the second ohmic contact pad 532 has an increasing gradient distribution along the direction from the side closer to the base substrate 10 to the side away from the base substrate 10; and the relatively less conductive element of the alloy of the second ohmic contact pad 532 has a decreasing gradient distribution along the direction from the side closer to the base substrate 10 to the side away from the base substrate 10.

In one example, the alloy is a metal silicon alloy, the relatively more conductive element of the alloy is a metal, and the relatively less conductive element of the alloy is silicon. Optionally, in the first ohmic contact pad 531, the metal of the alloy of the first ohmic contact pad 531 has an increasing gradient distribution along a direction from the side closer to the base substrate 10 to the side away from the base substrate 10, and silicon of the alloy of the first ohmic contact pad 531 has a decreasing gradient distribution along the direction from the side closer to the base substrate 10 to the side away from the base substrate 10. Optionally, in the second ohmic contact pad 532, the metal of the alloy of the second ohmic contact pad 532 has an increasing gradient distribution along the direction from the side closer to the base substrate 10 to the side away from the base substrate 10, and silicon of the alloy of the second ohmic contact pad 532 has a decreasing gradient distribution along the direction from the side closer to the base substrate 10 to the side away from the base substrate 10.

In some embodiments, the insulating crystallization inducing layer 30 is formed using a highly textured insulating material. Optionally, the material for making the insulating crystallization inducing layer 30 is selected so that a lattice constant of the highly textured insulating material is similar to a lattice constant of the crystallized semiconductor layer, to promote the crystallization induction process. Optionally, a material for making the insulating crystallization inducing layer 30 is selected so that a ratio of a lattice constant of the highly textured insulating material to a lattice constant of the crystallized semiconductor layer is in a range of 1.5:1 to 1:1.5, e.g., 1.4:1 to 1:1.4, 1.3:1 to 1:1.3, 1.2:1 to 1:1.2, 1.1:1 to 1:1.1, and 1.05:1 to 1:1.05. Examples of appropriate insulating and crystallization inducing materials for making the insulating crystallization inducing layer 30 include magnesium oxide, aluminum oxide, zirconium oxide, and hafnium oxide. Optionally, the insulating crystallization inducing layer 30 is formed to have a thickness in a range of 500 nm to 2000 nm, e.g., 500 nm to 700 nm, 700 nm to 900 nm, 900 nm to 1000 nm, 1000 nm to 1200 nm, 1200 nm to 1400 nm, 1400 nm to 1600 nm, 1600 nm to 1800 nm, and 1800 nm to 2000 nm.

In some embodiments, the alloy includes a relatively more conductive element (e.g., a conductive element) and a relatively less conductive element (e.g., a semi-conductive element). Optionally, the alloy is an alloy of a metal and a semiconductor material, e.g., a metal-silicon alloy. Examples of appropriate alloys include gold silicon alloy, aluminum silicon alloy, tin silicon alloy, and copper silicon alloy.

In some embodiments, the thin film transistor further includes a gate electrode. Optionally, the thin film transistor is a top gate type thin film transistor. Optionally, the thin film transistor is a bottom gate type thin film transistor. Optionally, and referring to FIG. and FIG. 2H, the gate electrode 20 is a side of the insulating crystallization inducing layer 30 closer to the base substrate 10. Optionally, the insulating crystallization inducing layer 30 also functions as a gate insulating layer insulating the gate electrode 20 from the active layer 42.

In another aspect, the present disclosure further provides a display apparatus. The display apparatus includes a thin film transistor described herein or fabricated by a method described herein, and further includes one or more integrated circuits for driving image display. Optionally, the display apparatus includes a display panel. Optionally, the display panel includes an array substrate and a counter substrate. Optionally, the array substrate includes a thin film transistor described herein or fabricated by a method described herein.

Optionally, the display apparatus is a liquid crystal display apparatus. Optionally, the display apparatus is an organic light emitting diode display apparatus. Optionally, the display apparatus is an electrophoretic display apparatus. In some embodiments, the display apparatus includes a plurality of subpixels arranged in an array having a plurality of rows and a plurality of columns. Optionally, each of the plurality of subpixels includes at least one thin film transistor described herein or fabricated by a method described herein. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of forming a crystallized semiconductor layer, comprising:
    forming an insulating crystallization inducing layer on a base substrate;
    forming a semiconductor material layer on a side of the insulating crystallization inducing layer away from the base substrate by depositing a semiconductor material on the insulating crystallization inducing layer, the semiconductor material being deposited at a deposition temperature that induces crystallization of the semiconductor material;
    forming an alloy crystallization inducing layer comprising an alloy on a side of the semiconductor material layer away from the insulating crystallization inducing layer; and
    annealing the alloy crystallization inducing layer to further induce crystallization of the semiconductor material to form the crystallized semiconductor layer;
    wherein annealing the alloy crystallization inducing layer is performed under a condition to enrich a relatively more conductive element of the alloy to a side away from the base substrate, and enrich a relatively less conductive element of the alloy to a side closer to the base substrate, thereby forming an annealed crystallization inducing layer.

2. The method of claim 1, wherein the relatively more conductive element of the alloy of the annealed crystallization inducing layer has an increasing gradient distribution along a direction from the side closer to the base substrate to the side away from the base substrate; and
    the relatively less conductive element of the alloy of the annealed crystallization inducing layer has a decreasing gradient distribution along the direction from the side closer to the base substrate to the side away from the base substrate.

3. The method of claim 1, wherein the insulating crystallization inducing layer is formed using a highly textured insulating material.

4. The method of claim 3, wherein a ratio of a lattice constant of the highly textured insulating material to a lattice constant of the crystallized semiconductor layer is in a range of 1.5:1 to 1:1.5.

5. The method of claim 1, wherein the insulating crystallization inducing layer comprises a material selected from a group consisting of magnesium oxide, aluminum oxide, zirconium oxide, and hafnium oxide.

6. The method of claim 1, wherein the alloy is a metal silicon alloy;
    the relatively more conductive element of the alloy is a metal; and
    the relatively less conductive element of the alloy is silicon.

7. The method of claim 6, wherein the alloy comprises a material selected from a group consisting of gold silicon alloy, aluminum silicon alloy, tin silicon alloy, and copper silicon alloy.

8. The method of claim 6, wherein the metal in the annealed crystallization inducing layer has an increasing gradient distribution along a direction from the side closer to the base substrate to the side away from the base substrate; and silicon in the annealed crystallization inducing layer has a decreasing gradient distribution along the direction from the side closer to the base substrate to the side away from the base substrate.

9. The method of claim 1, wherein the deposition temperature is in a range of 250 Celsius degrees to 400 Celsius degrees.

10. A method of fabricating a thin film transistor, comprising forming the crystallized semiconductor layer according to the method of claim 1;

patterning the annealed crystallization inducing layer and the crystallized semiconductor layer in a same patterning process using a single mask plate to form an active layer, the annealed crystallization inducing layer in a region outside a region corresponding to the active layer is substantially removed;

removing the annealed crystallization inducing layer in a region corresponding to a channel part of the active layer while at least partially maintaining the annealed crystallization inducing layer in regions corresponding to a source electrode contact part and a drain electrode contact part of the active layer, thereby forming an ohmic contact layer comprising a first ohmic contact pad on the source electrode contact part and a second ohmic contact pad on the drain electrode contact part; and forming a source electrode on a side of the first ohmic contact pad away from the base substrate, and a drain electrode on a side of the second ohmic contact pad away from the base substrate.

11. The method of claim 10, prior to forming the insulating crystallization inducing layer, further comprising forming a gate electrode on the base substrate;

wherein the insulating crystallization inducing layer is formed as a gate insulating layer insulating the gate electrode from the active layer.

12. A thin film transistor, comprising:
a base substrate;
an insulating crystallization inducing layer on the base substrate;
an active layer on a side of the insulating crystallization inducing layer away from the base substrate, the active layer having a channel part, a source electrode contact part, and a drain electrode contact part, the active layer comprising a crystallized semiconductor;
an ohmic contact layer comprising a first ohmic contact pad on a side of the source electrode contact part away from the insulating crystallization inducing layer and a second ohmic contact pad on a side of the drain electrode contact part away from the insulating crystallization inducing layer;
a source electrode on a side of the first ohmic contact pad away from the base substrate; and
a drain electrode on a side of the second ohmic contact pad away from the base substrate;
wherein the first ohmic contact pad comprises an alloy having a relatively more conductive element of the alloy enriched on a side of the first ohmic contact pad away from the base substrate and a relatively less conductive element of the alloy enriched on a side of the first ohmic contact pad closer to the base substrate; and the second ohmic contact pad comprises an alloy having a relatively more conductive element of the alloy enriched on a side of the second ohmic contact pad away from the base substrate and a relatively less conductive element of the alloy enriched on a side of the second ohmic contact pad closer to the base substrate.

13. The thin film transistor of claim 12, wherein the relatively more conductive element of the alloy of the first ohmic contact pad has an increasing gradient distribution along a direction from the side closer to the base substrate to the side away from the base substrate;

the relatively less conductive element of the alloy of the first ohmic contact pad has a decreasing gradient distribution along the direction from the side closer to the base substrate to the side away from the base substrate;

the relatively more conductive element of the alloy of the second ohmic contact pad has an increasing gradient distribution along the direction from the side closer to the base substrate to the side away from the base substrate; and the relatively less conductive element of the alloy of the second ohmic contact pad has a decreasing gradient distribution along the direction from the side closer to the base substrate to the side away from the base substrate.

14. The thin film transistor of claim 12, wherein the insulating crystallization inducing layer comprises a highly textured insulating material.

15. The thin film transistor of claim 14, wherein a ratio of a lattice constant of the highly textured insulating material to a lattice constant of the crystallized semiconductor is in a range of 1.5:1 to 1:1.5.

16. The thin film transistor of claim 12, wherein the insulating crystallization inducing layer comprises a material selected from a group consisting of magnesium oxide, aluminum oxide, zirconium oxide, and hafnium oxide.

17. The thin film transistor of claim 12, wherein the alloy is a metal silicon alloy;
the relatively more conductive element of the alloy is a metal;
the relatively less conductive element of the alloy is silicon;
the first ohmic contact pad comprises the metal enriched on a side of the first ohmic contact pad away from the base substrate and silicon enriched on a side of the first ohmic contact pad closer to the base substrate; and
the second ohmic contact pad comprises the metal enriched on a side of the second ohmic contact pad away from the base substrate and silicon enriched on a side of the second ohmic contact pad closer to the base substrate.

18. The thin film transistor of claim 17, wherein the alloy comprises a material selected from a group consisting of gold silicon alloy, aluminum silicon alloy, tin silicon alloy, and copper silicon alloy.

19. The thin film transistor of claim 12, further comprising a gate electrode on a side of the insulating crystallization inducing layer closer to the base substrate;
wherein the insulating crystallization inducing layer functions as a gate insulating layer insulating the gate electrode from the active layer.

20. A display apparatus, comprising the thin film transistor of claim 12, and one or more integrated circuits for driving image display.

* * * * *